(12) United States Patent
Kazama

(10) Patent No.: US 8,040,463 B2
(45) Date of Patent: Oct. 18, 2011

(54) SEMICONDUCTOR LIGHT-EMITTING DEVICE

(75) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/021,940

(22) Filed: Feb. 7, 2011

(65) Prior Publication Data

US 2011/0193120 A1 Aug. 11, 2011

(30) Foreign Application Priority Data

Feb. 9, 2010 (JP) ................................. 2010-026386

(51) Int. Cl.
*G02F 1/1335* (2006.01)

(52) U.S. Cl. ................. 349/64; 349/56; 349/61; 349/62

(58) Field of Classification Search ............. 349/56, 349/61, 62, 64
See application file for complete search history.

(56) References Cited

U.S. PATENT DOCUMENTS

| 7,923,723 | B2 * | 4/2011 | Hayashi et al. | 257/43 |
| 2006/0141645 | A1 * | 6/2006 | Yamazaki et al. | 438/22 |
| 2008/0277655 | A1 * | 11/2008 | Yamamoto et al. | 257/40 |

FOREIGN PATENT DOCUMENTS

| JP | 2002-217450 A | 8/2002 |
| JP | 2008-282851 A | 11/2008 |

* cited by examiner

*Primary Examiner* — Jennifer Doan
(74) *Attorney, Agent, or Firm* — Holtz, Holtz, Goodman & Chick, P.C.

(57) ABSTRACT

The device includes a support substrate, a reflective electrode on the support substrate; an AlGaInP-based semiconductor film including a light-emission layer and is provided on the reflective electrode, and a surface electrode provided on the semiconductor film. The surface electrode includes an ohmic electrode constituted by electrode pieces disposed on the semiconductor film in a distributed manner; the reflective electrode is constituted by a line electrode and dot electrodes provided on both sides of each of the electrode pieces, along the electrode pieces; the surface electrode and the reflective electrode are disposed so as to satisfy the following equations:

$b > a$, and $0.8(a^2 + 2ab)^{1/2} < c < 2.4(a^2 + 2ab)^{1/2}$.

4 Claims, 13 Drawing Sheets

<COMPARATIVE EXAMPLE-1>

<COMPARATIVE EXAMPLE-2>

SIMULATION RESULTS OF CURRENT DENSITY DISTRIBUTION
(CURRENT DENSITY DIFFERENCE)

| SEMICONDUCTOR FILM THICKNESS | COMPARATIVE EXAMPLE-1 | COMPARATIVE EXAMPLE-2 | EMBODIMENT |
|---|---|---|---|
| 6 μm | 500A/cm² | 160A/cm² | 70A/cm² |
| 14.5 μm | 180A/cm² | 170A/cm² | 190A/cm² |

FIG. 11

MEASUREMENT RESULTS OF EMISSION DISTRIBUTION

| SEMICONDUCTOR FILM THICKNESS | COMPARATIVE EXAMPLE-1 | EMBODIMENT |
|---|---|---|
| 6 μm | | |
| 14.5 μm | | |

FIG. 13

CURRENT VALUE AT SATURATED LIGHT OUTPUT

| SEMICONDUCTOR FILM THICKNESS | COMPARATIVE EXAMPLE-1 | EMBODIMENT |
|---|---|---|
| 6 μm | 142 mA | 160 mA |
| 14.5 μm | 116 mA | 159 mA |

FIG. 14

FORWARD VOLTAGE (AT 90 mA)

| SEMICONDUCTOR FILM THICKNESS | COMPARATIVE EXAMPLE-1 | EMBODIMENT |
|---|---|---|
| 6 μm | 2.60 V | 2.25 V |
| 14.5 μm | 2.48 V | 2.27 V |

SEMICONDUCTOR LIGHT-EMITTING DEVICE

BACKGROUND OF THE INVENTION

1. Technical Field

The invention relates to a light-emitting device such as a light-emitting diode (LED), and particularly to an electrode structure of a semiconductor light-emitting device.

2. Description of the Related Art

There have conventionally been configurations of the electrode structure of an LED as noted below. Specifically, a semiconductor light-emitting device is described in Japanese Laid-open Patent Publication No. 2002-217450 (referred to as Patent Document 1 hereinafter). In this device, an electroconductive reflective film is formed between an electroconductive support substrate and a semiconductor layer that includes a light-emission layer, and which is provided with an island-shaped alloy contact layer periodically arranged on the electroconductive reflective film. It is noted in the description that such a configuration makes it possible to obtain a structure in which an ohmic contact region having low contact resistance and a highly optically reflective region having high optical reflectivity are repeated periodically on the interface between the semiconductor layer and electroconductive reflective film.

It is noted in the description of Japanese Laid-open Patent Publication No. 2008-282851 (referred to as Patent Document 2 hereinafter) that a plurality of ohmic contact electrodes are provided to a reflective film formed between a semiconductor layer and a Si support substrate, wherein each of the ohmic contact electrodes is arranged so that the distance from a surface electrode provided on the light extraction surface is the same. It is noted in the description that such a configuration makes it possible to inject the electric current uniformly into each of the ohmic contact electrodes and to prevent current concentration and an increase in forward voltage.

The light-emission efficiency of an LED depends on the current density injected into the light-emission or active layer. Specifically, when the current density increases, the carrier injected into the active layer overflows, causing the carriers contributing to light emission to decrease, and the light-emission efficiency to decrease. Furthermore, localized current concentration brings about electrical field concentration and heat generation, causes more crystal defects to grow, and adversely affects reliability.

In the case of the electrode structure described in the Patent Document 1, a uniform distance cannot be established between each of the island-shaped electrodes arranged in a distributed manner on the electroconductive reflective film and the surface electrode provided on the light extraction surface. Therefore, the current is concentrated in a path having the minimum distance between the electrodes, and light distribution becomes nonuniform.

In the case of the electrode structure described in the Patent Document 2, it seems that uniformity or inhomogeneity of the current density can be prevented because the distance between the surface electrode and each of the ohmic contact electrodes is the same. If, however, there is a slight difference in resistive components between the electrodes, the current will be concentrated in lower-resistance portions, creating a nonuniform light-emission distribution and adversely affecting reliability. A difference in resistive components between the electrodes may be attributed, for example, to a positional shift of an electrode caused in the production process, a difference in the sizes of ohmic contact electrodes arranged on a reflective surface in a distributed manner, a difference in contact resistance between an electrode and a semiconductor film, and other factors. Completely eliminating these factors is very difficult.

A method is also used in which the resistance of a semiconductor film is reduced by increasing the thickness of the semiconductor film, whereby current diffusion is facilitated and a uniform current density distribution is achieved. Using a thicker semiconductor film increases the amount of light absorption in the semiconductor film, resulting in reduced light-emission efficiency and increased production time and material cost. Production costs increase as a result.

Furthermore, a uniform current density distribution can be obtained by increasing the surface area of the electrodes, but increasing the surface area of the electrodes on the light extraction surface side will cause a decrease in the efficiency of light extraction.

SUMMARY OF THE INVENTION

In consideration of the respects described above, an object of the invention is to provide a semiconductor light-emitting device in which localized current concentration can be prevented and a uniform distribution of light emission can be obtained without accompanying increase in the surface area of the electrodes on the light extraction surface side or in the thickness of the semiconductor film.

The semiconductor light-emitting device according to the present invention, there is provided a semiconductor light-emitting device including a support substrate, a reflective electrode that has optical reflectivity and is provided on the support substrate; an AlGaInP-based semiconductor film that includes a light-emission layer and is provided on the reflective electrode, and a surface electrode provided on the semiconductor film, wherein the surface electrode includes an ohmic electrode constituted by a plurality of electrode pieces disposed on the semiconductor film in a distributed manner and used for forming an ohmic contact with the semiconductor film;

the reflective electrode is constituted by a linearly shaped line electrode and a plurality of island-shaped dot electrodes provided on both sides of each of the electrode pieces that constitute the ohmic electrode, along the electrode pieces;

the surface electrode and the reflective electrode are disposed so as to satisfy the following equations:

$$b>a, \text{ and } 0.8(a^2+2ab)^{1/2}<c<2.4(a^2+2ab)^{1/2},$$

where "a" is the distance between the line electrode and the dot electrodes, "b" is the distance between the ohmic electrode and the dot electrodes when the ohmic electrode and the dot electrodes are projected onto a plane parallel to the principal surface of the semiconductor film, and "c" is the distance between mutually adjacent dot electrodes; and the thickness of the semiconductor film is 6 μm or less.

With the semiconductor light-emitting device according to the invention, localized current concentration can be prevented and a uniform distribution of light emission can be obtained without accompanying increase in the surface area of the electrodes on the light extraction surface side or in the thickness of the semiconductor film.

BRIEF DESCRIPTION OF THE DRAWINGS

FIG. 11 is a diagram showing the measurement result of the light-emission distribution;

FIG. 13 is a diagram showing the current when the light output is saturated;

FIG. 14 is a diagram showing the measurement results of the forward voltage.

DETAILED DESCRIPTION OF THE INVENTION

First Embodiment

Figure 1:
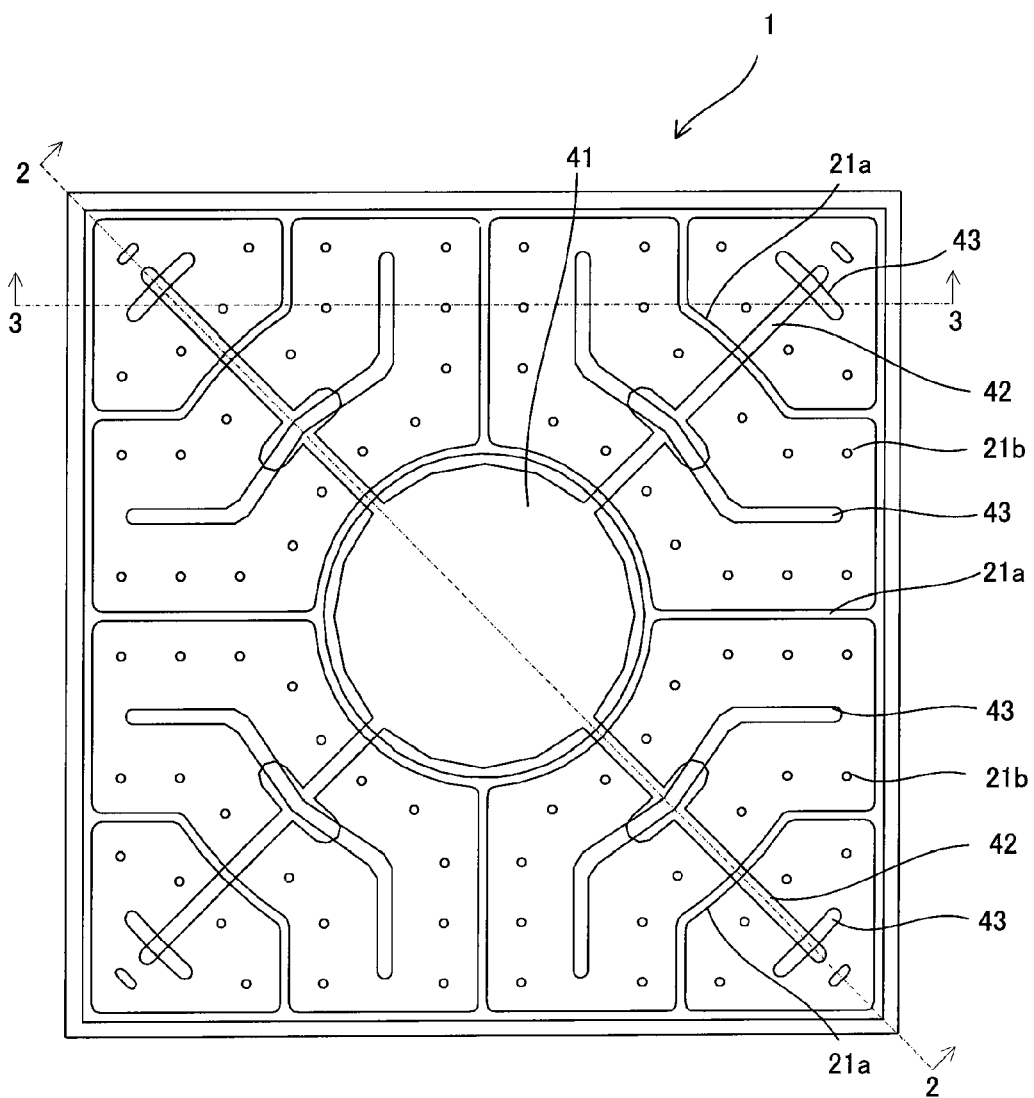
FIG. 1 is a plan view showing the electrode configuration of the semiconductor light-emitting device according to an embodiment of the present invention.

Embodiments of the invention are described below with reference to the accompanying drawings. In the drawings shown below, the same reference numerals are attached to substantially the same or equivalent elements and portions.

Figure 2:
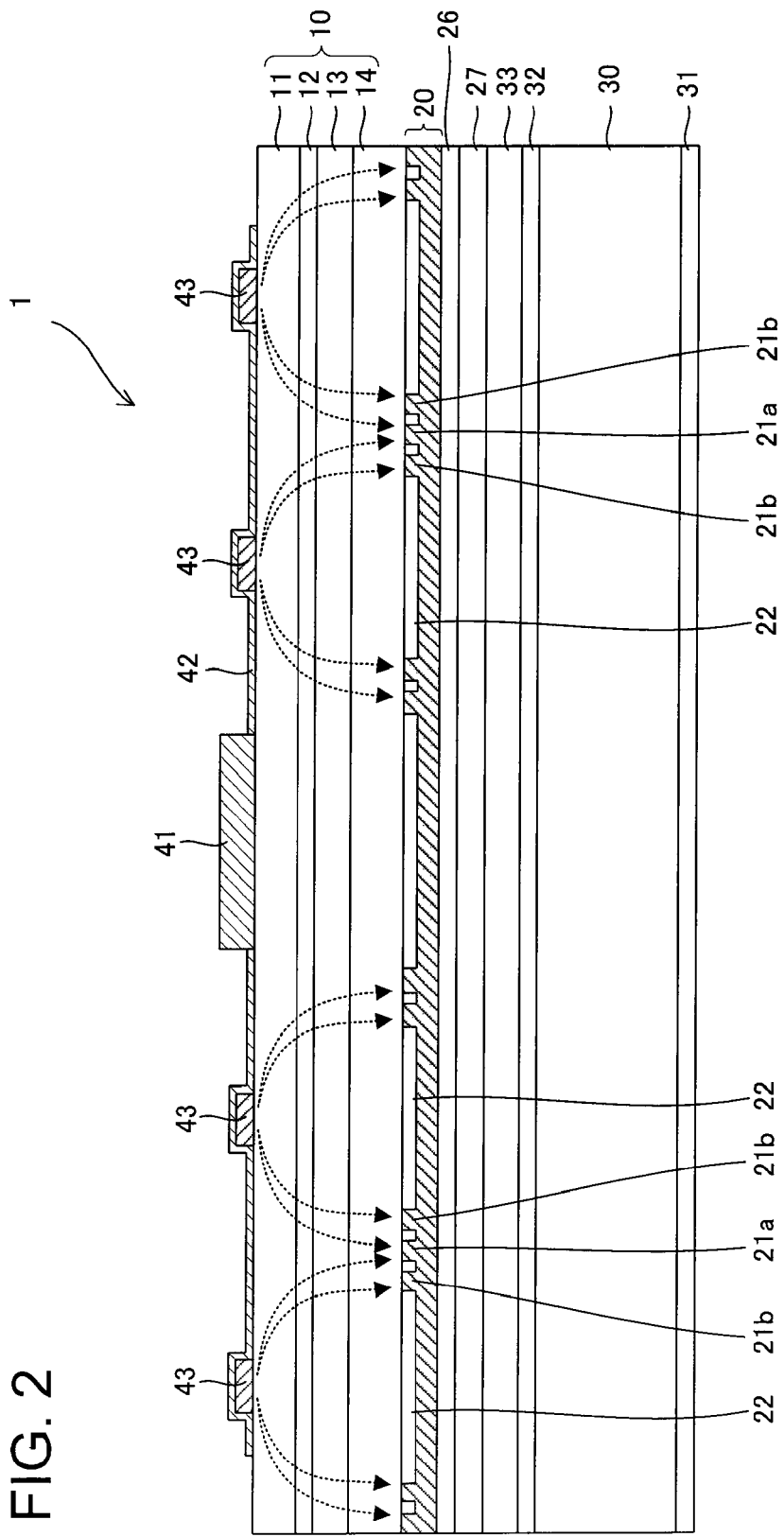
FIG. 2 is a cross-sectional view along line 2-2 in FIG. 1.
Figure 3:
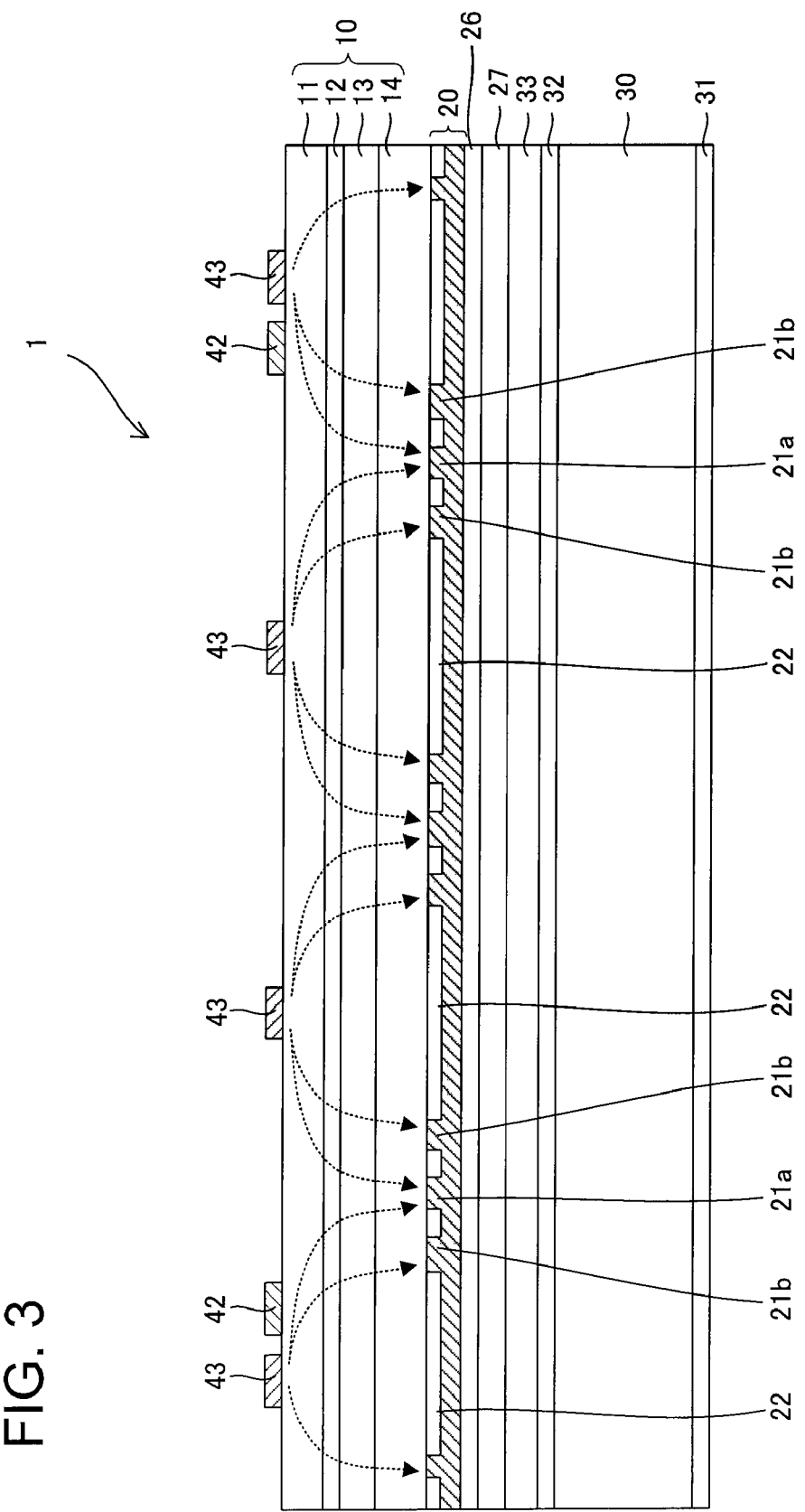
FIG. 3 is a cross-sectional view along line 3-3 in FIG. 1.

FIG. 1 is a plan view showing the electrode configuration of the semiconductor light-emitting device 1 according to a first embodiment of the present invention, and FIGS. 2 and 3 are cross-sectional views along lines 2-2 and 3-3, respectively, in FIG. 1.

The semiconductor light-emitting device 1 has a so-called joined or bonded structure in which a semiconductor film 10 and a support substrate 30 are joined together via a reflective electrode layer 20. The semiconductor film 10 is configured by sequentially layering, starting from a light-extraction surface side, an n-type cladding layer 11, a light-emission layer 12, a p-type cladding layer 13, and a p-type contact layer 14. The overall thickness of the semiconductor film is, for example, 6 μm. The n-type cladding layer 11 is made of, for example, $(Al_{0.7}Ga_{0.3})_{0.5}In_{0.5}P$, and is 3 μm thick. The light-emission layer 12 has, for example, a multiple quantum well structure and is obtained by layering a well layer composed of $(Al_{0.1}Ga_{0.9})_{0.5}In_{0.5}P$ and provided with a thickness of about 20 nm, and a barrier layer composed of $(Al_{0.56}Ga_{0.44})_{0.5}In_{0.5}P$ and provided with a thickness of about 10 nm in an alternating and repeating manner for 15 times. The p-type cladding layer 13 is made of, for example, $(Al_{0.7}Ga_{0.3})_{0.5}In_{0.5}P$, and is 1 μm thick. The p-type contact layer 14 is made of, for example, $Ga_{0.9}In_{0.1}P$, and is 1.5 μm thick.

The reflective electrode layer 20 is provided adjacent to the p-type contact layer 14. The reflective electrode layer 20 is constituted by a dielectric layer 22 and a reflective electrode 21. The dielectric layer 22 is made of, for example, $SiO_2$ and is formed near the interface with the p-type contact layer 14. The reflective electrode 21 is made of, for example, AuZn and is in contact with the p-type contact layer 14 at the opening portion of the dielectric layer 22 (see, FIGS. 6B and 6C). The contact between the reflective electrode 21 and p-type contact layer 14 is an ohmic contact. The reflective electrode layer 20 constituted by the dielectric layer 22 and the reflective electrode 21 forms a light reflection surface for reflecting the light emitted from the light-emission layer 12 toward the light-extraction surface at the interface with the semiconductor film 10, and also serves as an electrode for supplying the semiconductor film 10 with a current.

At a position near the interface with the p-type contact layer 14, the dielectric layer 22 separates the reflective electrode 21 into a line electrode 21a on the light-reflection surface side of a linear-shape (hereinafter, referred to as a "light-reflection-surface-side line electrode", or simply referred to as a "line electrode") and a dot electrodes 21b on the light-reflection surface side of an island-shape (hereinafter, referred to as a "reflection-surface-side dot electrodes", or simply referred to as a "dot electrodes"). The line electrode 21a and the dot electrodes 21b are linked together in a lower portion of the dielectric layer 22 and are electrically connected to each other. The configurations of the line electrode 21a and the dot electrodes 21b are described later in detail. The material of the dielectric layer 22 can be, in addition to $SiO_2$, a transparent dielectric material such as $Si_2N_4$, $Al_2O_2$, or the like. Furthermore, the material of the reflective electrode 21 is not limited to AuZn and is preferably a material that can form ohmic contact with the p-type contact layer 14 and has high light reflectivity.

A barrier metal layer 26 and an adhesive layer or joining layer 27 are disposed on the reflective electrode layer 20. The barrier metal layer 26 may constitute a single layer or two or more layers including a high-melting metal such as Ta, Ti, W, or the like, or a nitride of thereof. The barrier metal layer 26 prevents the Zn in the reflective electrode 21 from diffusing to the outside, and prevents the eutectic joint or joining material (e.g., AuSn) in an adhesive or joining layer 33 from diffusing in the reflective electrode 21. The adhesive layer 27 is a layered film made of, for example, Ni and Au, and serves to improve wettability relative to the eutectic joint material contained in the adhesive layer 33. This makes it possible to improve joining between the support substrate 30 and the semiconductor film 10.

The support substrate 30 is a Si substrate that is rendered electroconductive by doping, for example, a p-type impurity in a high concentration. Ohmic metal layers 31 and 32, which are made of, for example, Pt, are formed on the two surfaces of the support substrate 30, and these are bonded to the electrode layer 20 via the adhesive layer 33. The adhesive layer 33 has a layered structure produced by forming, for example, Ti, Ni, and AuSn in sequence from the side near the support substrate 30. The support substrate 30 can also be made of an electroconductive material such as Ge, Al, Cu, or the like, in addition to Si.

A light-extraction-surface-side Schottky electrode 41 (hereinafter, simply referred to as "Schottky electrode") and a light-extraction-surface-side ohmic electrode 43 (hereinafter, simply referred to as "ohmic electrode") which constitute the surface electrode are formed on the surface of the n-type cladding layer 11 that constitutes the light-extraction surface. The Schottky electrode 41 constitutes a bonding pad and can be composed, for example, of Ta, Ti, W, an alloy thereof, or another material capable of forming a Schottky contact with the n-type cladding layer 11. The Schottky electrode can be made not only of a metallic material but also of a dielectric material such as $SiO_2$. A Au layer may be formed on the outermost surface of the Schottky electrode 41 in order to improve wire-bonding performance and electrical conductivity. The ohmic electrode 43 is formed, for example, from AuGeNi, AuSn, AuSnNi, or another material capable of forming an ohmic contact with the n-type cladding layer 11. The Schottky electrode 41 and the ohmic electrode 43 are electrically connected by connecting wirings 42 that link the two electrodes. The connecting wirings 42 are made of the same material as that of the Schottky electrode 41, and form a Schottky contact with the n-type cladding layer 11. Because the Schottky electrode 41 forms a Schottky contact with the n-type cladding layer 11, a current is not allowed to flow into the semiconductor film 10 immediately underneath the Schottky electrode 41. Specifically, the current flows between the ohmic electrode 43 on the light-extraction surface and the line electrode 21a on the light reflection surface, as well as between the ohmic electrode 43 and the dot electrodes 21b. The current flow paths in the semiconductor film 10 are indicated by arrows in FIGS. 2 and 3. The structures of the Schottky electrode 41 and the ohmic electrode 43 are described in detail later.

The structures of individual electrodes provided on the light-extraction surface side and the light-reflection surface side are described in detail below.

Figure 4A:
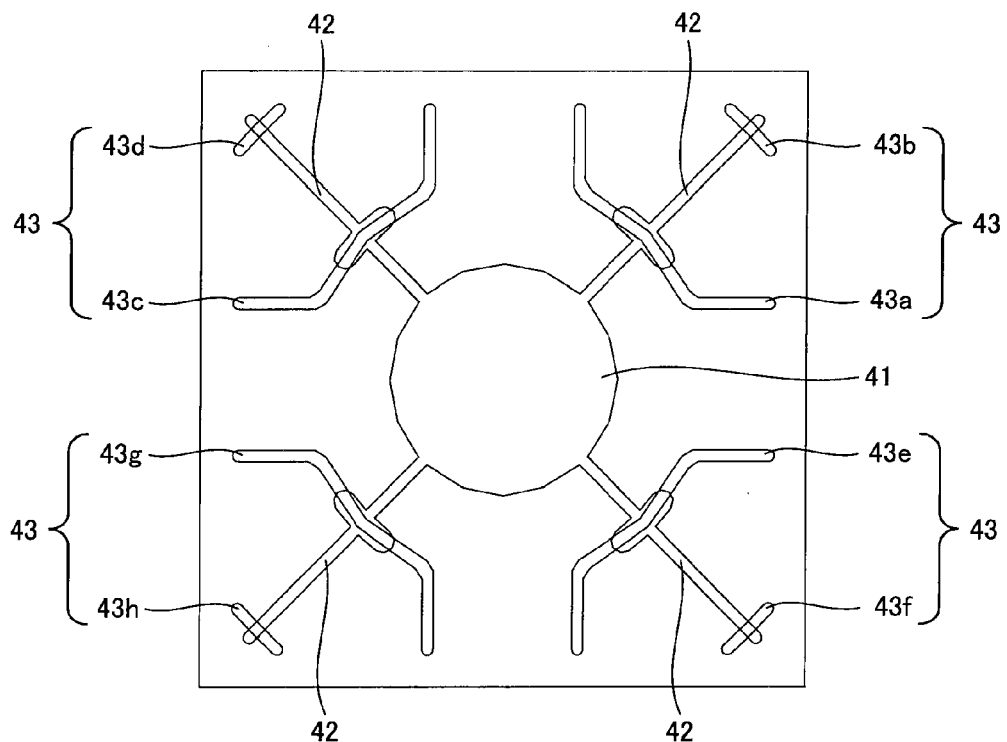
FIG. 4A is a plan view showing the configuration of a surface electrode according to an embodiment of the present invention.

To facilitate understanding, FIG. 4A shows only the Schottky electrode 41 and the ohmic electrode 43 constituting the surface electrode provided on the light-extraction surface side of the semiconductor light-emitting device 1. The semiconductor light-emitting device 1 is, for example, a 310 μm square (i.e., side-length of 310 μm). The Schottky electrode 41 has, for example, a circular shape having a diameter of 100 μm diameter disposed at the center of the light-extraction surface. The linear connecting wirings 42, which have a width of 5 μm and extend to each corner of the semiconductor light-emitting device 1, are connected to the Schottky electrode 41. Each of the four connecting wirings 42 is provided with the linear ohmic electrode 43 having a width of 5 μm so as to intersect with the wirings. The ohmic electrode 43 is constituted by eight electrode pieces 43a through 43h disposed in a distributed manner in areas near the corners of the semiconductor light-emitting device 1 along the four connecting wirings 42 and in areas away from the corners and somewhat toward the center. The surface electrode constituted by the Schottky electrode 41 and the ohmic electrode 43 is patterned so as to achieve four-quadrant rotational symmetry (i.e., so as to overlap when rotated 90 degrees) when rotated about the center of the semiconductor light-emitting device 1. The individual electrode pieces 43a through 43h of the ohmic electrode 43 disposed in a distributed manner are electrically connected to the Schottky electrode 41 via the connecting wirings 42. Configuring the surface electrode in this manner brings the proportion (coverage ratio) of the light-extraction surface occupied by the ohmic electrode 43 to 4.8% and allows the proportion to be markedly reduced in comparison with a conventional common electrode configuration. Reducing the coverage ratio of the electrode on the light extraction surface makes it possible to improve light extraction efficiency.

Figure 4B:
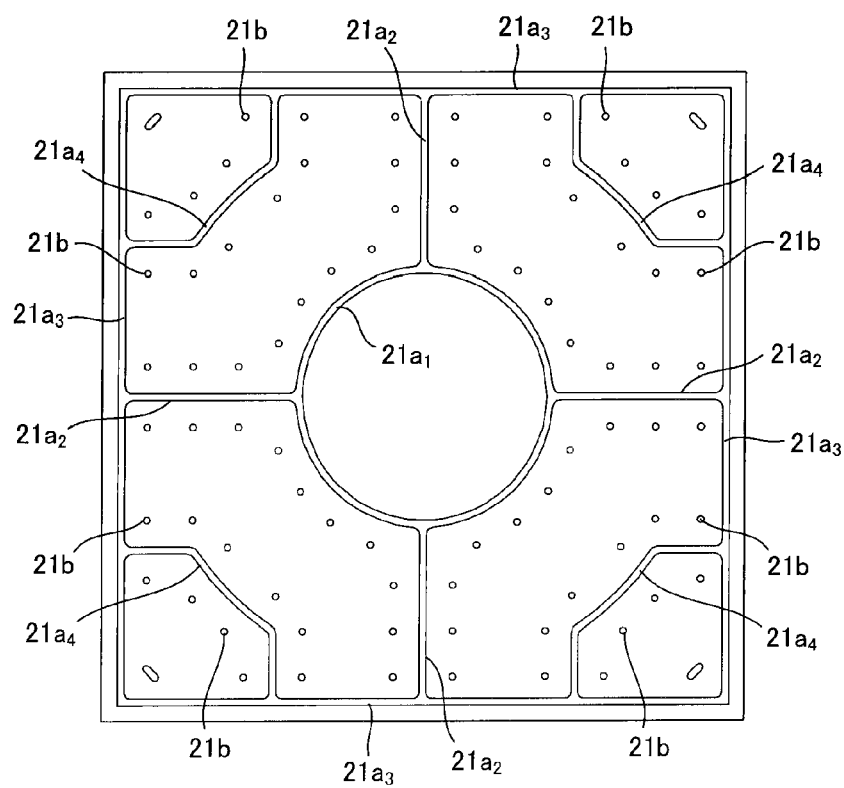
FIG. 4B is a plan view showing the configuration of a reflective electrode according to an embodiment of the present invention.

To facilitate understanding, FIG. 4B shows only the line electrode 21a and the dot electrodes 21b which are provided on the light reflection surface side. Each of the line electrodes 21a is shaped as a line having a width of 5 μm; is constituted by a first portion $21a_1$ of a circular shape formed so as to surround the outer edge of the Schottky electrode 41 on the light-extraction surface, a second portion $21a_2$ of a approximately cross-shape that is connected to the first portion $21a_1$ and extends toward the edges of the semiconductor light-emitting device 1, a third portion $21a_3$ that is connected to the second portion $21a_2$ and extends along the outer edge of the semiconductor light-emitting device 1, and a fourth portion $21a_4$ disposed near the corners of the semiconductor light-emitting device 1 and connected to the third portion $21a_3$ so as to straddle or bridge two sides or edges containing the respective corners. The line electrode 21a has a continuous shape in which the individual constituent portions $21a_1$ through $21a_4$ are interconnected via other constituent portions. Each of the dot electrodes 21b is, for example, shaped as a circle having a diameter of 5 μm. A plurality of dot electrodes 21b is disposed in a distributed manner along the individual constituent portions of the line electrode 21a. The diffusion of current even in a thin semiconductor film 10 is thus facilitated by disposing the dot electrodes 21b in a distributed manner on the reflection surface side, and concentration of current in the dot electrodes 21b is prevented by the joint use of the line electrode 21a. In the present embodiment, the reflective electrode 21 constituted by the line electrode 21a and the dot electrodes 21b is patterned so as to achieve a four-quadrant rotational symmetry in which the center point of the semiconductor light-emitting device 1 is defined as the center of rotation. Configuring the electrodes on the light reflection surface side in this manner allows the proportion (coverage ratio) of the surface area of the line electrode 21a and the dot electrodes 21b at the interface between the reflective electrode layer 20 and the semiconductor film 10 to be set to 17.4%, which is three times or more of the coverage ratio for the ohmic electrode 43 on the light-extraction surface side. The reflectivity of a light reflection surface decreases with an increase in the coverage ratio of the electrodes on the light reflection surface side. With the electrode configuration according to the present embodiment, however, the coverage ratio of the ohmic electrode 43 on the light-extraction surface side is sufficiently low, and there is therefore no decrease in the efficiency of light extraction in comparison with the conventional art.

Referring to FIG. 1, the light-extraction-surface-side Schottky electrode 41 and the light-extraction-surface-side ohmic electrode 43 in the light-emitting device 1 are shown superimposed or overlaid in the same plane (or, projected on a plane parallel to the principal plane of the semiconductor film 10), as are the reflection-surface-side line electrode 21a and the reflection-surface-side dot electrodes 21b. The line electrode 21a and the dot electrodes 21b on the reflection surface side are disposed on both sides (i.e., both sides in the projection plane) of each of the eight electrode pieces 43a through 43h, which constitute the ohmic electrode 43 on the light-extraction surface side, along the electrode pieces (see, FIGS. 1, 4A and 4B). In other words, the dot electrodes 21b on the reflection surface side are formed so as to surround (i.e., in the projection plane parallel to the principal plane) the individual electrode pieces 43a through 43h of the ohmic electrode 43 on the light-extraction surface side, and each of the electrode pieces 43a through 43h is disposed at the center of the area surrounded by the line electrode 21a on the reflection surface side. The ohmic electrode 43 on the light-extraction surface side, the line electrode 21a on the reflection surface side, and the dot electrodes 21b on the reflection surface side are disposed so as not to overlap each other in the thickness direction (or, in the plane parallel to the principal plane) of the semiconductor film 10, forming a so-called counter electrode. This electrode configuration allows the current to be widely diffused within the semiconductor film 10 even when the ohmic electrode 43 on the light-extraction surface side has a small surface area. Therefore, it is possible to reduce the coverage ratio of the electrodes on the light-extraction surface side and to improve the efficiency of the light extraction. This electrode configuration also allows the distance between the electrode on the light-extraction surface side and the electrode on the reflection surface side to be reduced, making it possible to achieve a lower forward voltage $V_F$. In the present embodiment, the overall electrode shape that includes the electrodes on the light-extraction surface side and the electrodes on the reflection surface side is patterned so as to achieve four-quadrant rotational symmetry when rotated about the center of the semiconductor light-emitting device 1. This makes it possible to obtain an isotropic light distribution when an illumination apparatus is configured by combining a lens or the like and the semiconductor light-emitting device 1 according to the present embodiment.

Figure 5C:
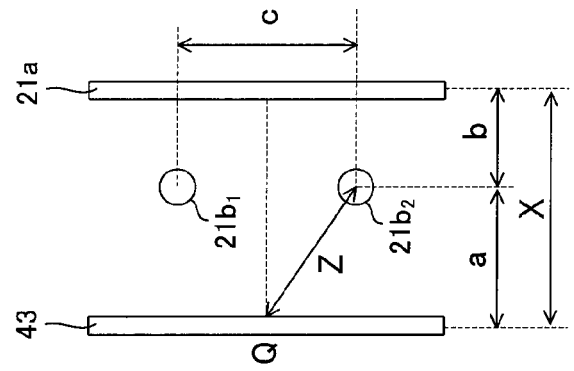
FIGS. 5A through 5C are diagrams showing the dispositions of individual electrodes in the semiconductor light-emitting device according to an embodiment of the present invention.
Figure 5B:
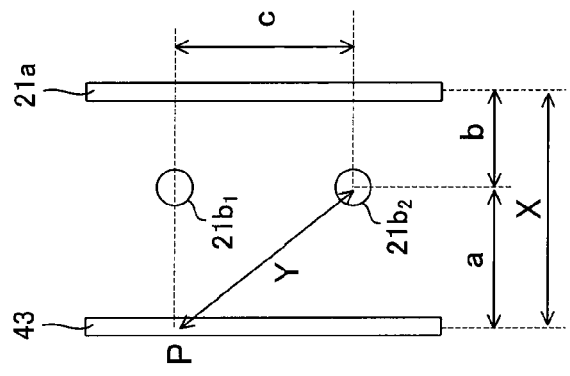
Figure 5A:
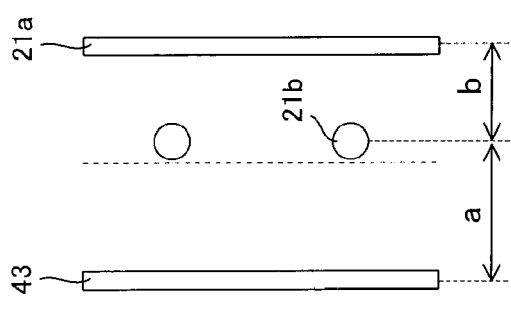

Next, the relative arrangement of the ohmic electrode 43 on the light-extraction surface side, and the line electrode 21a and the dot electrodes 21b on the reflection surface side required for achieving a uniform current density distribution without allowing an increase in the thickness of the semiconductor film 10 is described with reference to FIGS. 5A to 5C. In order to achieve a uniform current density distribution, the three conditions shown below must be satisfied. FIGS. 5A through 5C are diagrams for describing conditions 1 through 3, respectively. These drawings show portions of the ohmic electrode 43 on the light-extraction surface side, the line electrode 21a and dot electrodes 21b on the reflection surface side shown in FIG. 1. In FIG. 5, the ohmic electrode 43 on the light-extraction surface side, and the line electrode 21a and the dot electrodes 21b on the reflection surface side are shown in the same plane.

<Condition 1>

As shown in FIG. 5A, the electrodes are disposed so that b>a (1)

where "a" is the distance between the line electrode 21a and the dot electrodes 21b on the reflection surface side, and "b" is the horizontal distance between the ohmic electrode 43 on the light-extraction surface side and the dot electrodes 21b on the reflection surface side.

Equation (1) can be modified as follows.

$$b > (a+b)/2 \quad (1)'$$

This means that the dot electrodes 21b on the reflection surface side is disposed toward the line electrode 21a on the reflection surface side and away from the midpoint between the ohmic electrode 43 on the light-extraction surface side and line electrode 21a on the reflection surface side. The term "horizontal distance" refers to a distance where the ohmic electrode 43 on the light-extraction surface side, the line electrode 21a and the dot electrodes 21b on the reflection surface side are projected onto the same plane parallel to the principal plane of the semiconductor film 10, rather than to the actual distance in which the thickness of the semiconductor film 10 is taken into account. Arranging the electrodes in this manner allows the resistance between the line electrode 21a and the dot electrodes 21b on the reflection surface side to be smaller than the resistance between the dot electrodes 21b on the reflection surface side and the ohmic electrode 43 on the light-extraction surface side. As a result, the current supplied from the ohmic electrode 43 on the light-extraction surface side can be easily diffused to the line electrode 21a on the reflection surface side as well, and the current can be prevented from concentrating to the dot electrodes 21b on the reflection surface side.

<Condition 2>

As shown in FIG. 5B, the electrodes are disposed so that X<Y (2)

where "c" is the distance between two mutually adjacent dot electrodes $21b_1$ and $21b_2$ disposed on the reflection surface side, "X" (equal to a+b) is the distance between the ohmic electrode 43 on the light-extraction surface side and the line electrode 21a on the reflection surface side, "P" is the point at which a perpendicular line drawn from the a dot electrode $21b_1$ on the reflection surface side toward the ohmic electrode 43 on the light-extraction surface side intersects with the ohmic electrode 43, and "Y" is the distance between the point of intersection P and the dot electrode $21b_2$ on the reflection surface side.

Equation (2) can be expressed as follows:

$$c > (a^2 + 2ab)^{1/2} \quad (2)'$$

Such an electrode arrangement causes the current to flow toward the line electrode 21a on the reflection surface side rather than to the dot electrode $21b_2$ on the reflection surface side when the current is increased from a state in which the current density at the dot electrode $21b_1$ on the reflection surface side reaches a certain current density. Specifically, it is possible to prevent the current from concentrating onto the dot electrodes 21b on the reflection surface side when a relatively large current is injected.

<Condition 3>

As shown in FIG. 5C, the electrodes are disposed so that X>Z (3)

where "Q" is the point at which a perpendicular line drawn from the midpoint between two mutually adjacent dot electrodes $21b_1$ and $21b_2$ on the reflection surface side toward the ohmic electrode 43 on the light-extraction surface side intersects with the ohmic electrode 43, and "Z" is the distance between point Q and the dot electrode $21b_1$ or $21b_2$ on the reflection surface side.

Equation (3) can be expressed as follows:

$$c < 2(a^2 + 2ab)^{1/2} \quad (3)'$$

Such an electrode arrangement causes the current from point Q on the ohmic electrode 43 on the light-extraction surface side to flow toward the dot electrodes $21b_1$ and $21b_2$ on the reflection surface side rather than to the line electrode 21a on the reflection surface side, making it possible to prevent the current from concentrating to the line electrode 21a on the reflection surface side.

Summarizing the conditions 1 through 3 described above, the following must be satisfied:

$$b > a, \text{ and } (a^2 + 2ab)^{1/2} < c < 2(a^2 + 2ab)^{1/2} \quad (4)$$

in order to obtain a uniform current density distribution in the semiconductor film 10. It may, however, be difficult to dispose the electrodes so as to completely satisfy Equation (4), depending the chip size and other limitations. Therefore, the electrode arrangement conditions indicated by Equation (4) should be used as a guideline in determining the electrode arrangement. For example, the uniform character of the current density distribution will be affected only moderately if the range of distances "c" between dot electrodes adjacent to each other diverges by about ±20% in either direction from the range indicated by Equation (4). Specifically, a uniform current density distribution can still be obtained under the following conditions:

$$b>a, \text{ and } 0.8(a^2+2ab)^{1/2}<c<2.4(a^2+2ab)^{1/2} \quad (5)$$

The electrode configuration according to the present embodiment will thus allow a uniform current density distribution to be designed for a thin semiconductor film 10 because the line electrode 21a and the dot electrodes 21b are disposed so as to mutually prevent current concentration from occurring.

The method for producing a semiconductor light-emitting device 1 according to the embodiment of the invention will be described. FIGS. 6A through 6D, and FIGS. 7A through 7C are cross-sectional views showing the method for producing a semiconductor light-emitting device 1.

<Semiconductor Film Formation Step>

Figure 6A:
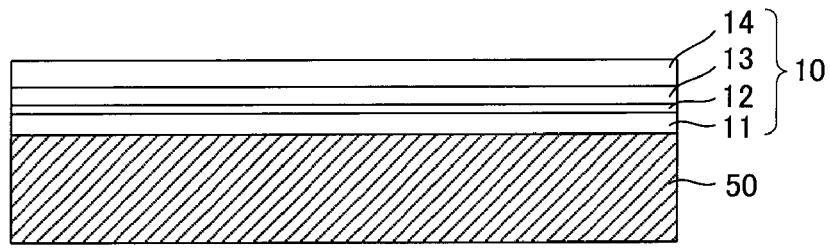
FIGS. 6A through 6D are cross-sectional views showing a method for producing the semiconductor light-emitting device according to an embodiment of the present invention.

A semiconductor film 10 was formed by metalorganic chemical vapor deposition (MOCVD). An n-type GaAs substrate having a thickness of 300 μm and an incline of 15 degrees to the [011] direction from the (100) plane was used as a growth substrate 50 to grow the semiconductor film 10. A $(Al_{0.7}Ga_{0.3})_{0.5}In_{0.5}P$ n-type cladding layer 11 having a thickness of 3 μm was formed on the growth substrate 50. An light-emission layer 12 was formed on the n-type cladding layer 11. A multiple quantum well structure was formed for the light-emission layer 12 by repeatedly layering a $(Al_{0.1}Ga_{0.9})_{0.5}In_{0.5}P$ well layer having a thickness of about 20 nm, and a $(Al_{0.56}Ga_{0.44})_{0.5}In_{0.5}P$ barrier layer having a thickness of about 10 nm in an alternating manner for 15 times. The Al composition of the well layer can be adjusted to within a range of $0 \leq z \leq 0.4$ in line with an emission wavelength. A $(Al_{0.7}Ga_{0.3})_{0.5}In_{0.5}P$ p-type cladding layer 13 having a thickness of 1 μm was formed on the light-emission layer 12. The Al composition z of the n-type cladding layer 11 and the p-type cladding layer 13 can be adjusted to within a range of $0.4 \leq z \leq 1.0$. A $Ga_{0.9}In_{0.1}P$ p-type contact layer 14 having a thickness of 1.5 μm was formed on the p-type cladding layer 13. The indium (In) composition of the p-type contact layer 14 can be adjusted to within a range in which the light from the light-emission layer 12 is not absorbed. A semiconductor film 10 having a thickness of 6 μm is constituted by the aforementioned individual layers (FIG. 6A). Phosphine ($PH_3$) was used as the Group V material, and an organic metal such as trimethyl gallium (TMGa), trimethyl aluminum (TMAl), or trimethyl indium (TMI) was used as the Group III material. Silane (SiH4) was used as the material for silicon that is an n-type impurity, and dimethyl zinc (DMZn) was used as the material for Zn that is a p-type impurity. The growth temperature was set to from 750 to 850° C., hydrogen was used as a carrier gas, and the growth pressure was set to 10 kPa.

<Step for Forming Reflective Electrode Layer and Metal Layer>

Figure 6B:
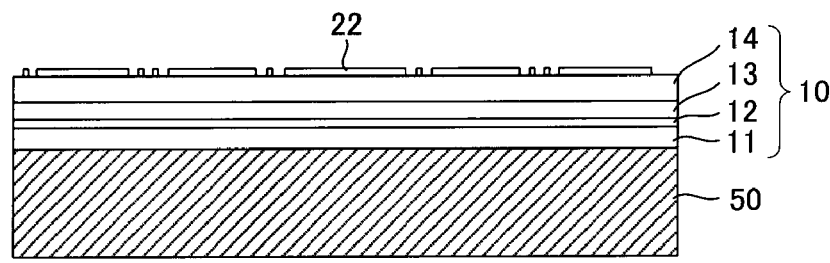

An $SiO_2$ film constituting the dielectric layer 22 was formed on the p-type contact layer 14 by plasma CVD. The thickness "d" of the $SiO_2$ film was set so as to satisfy the relation $d = m \cdot \lambda_0/4n$, where "$\lambda_0$" is the emission wavelength in a vacuum, "n" is the refractive index of an $SiO_2$ film, and "m" is an arbitrary integer. Here, the thickness of the dielectric layer 22 was set to d=320 nm on the assumption that $\lambda_0$=625 nm, n=1.45 nm, and m=3. Then, a resist mask was formed on the $SiO_2$ film, and etching was then performed using buffered hydrofluoric acid (BHF) to provide the $SiO_2$ film with a pattern corresponding to the line electrode 21a and the dot electrodes 21b on the reflection surface side. An opening portion was formed in a portion where the $SiO_2$ film had been removed, and the p-type contact layer 14 was exposed in the opening portion (FIG. 6B). Thermal CVD or sputtering can also be used to form the $SiO_2$ film. Dry etching can also be used to etch the $SiO_2$ film. The material of the dielectric layer 22 can be, in addition to $SiO_2$, a transparent dielectric material such as $Si_3N_4$ or $Al_2O_3$.

Figure 6C:
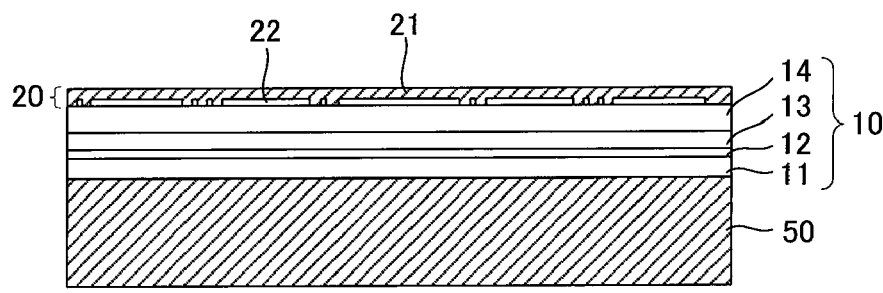

An AuZn reflective electrode 21 having a thickness of 300 nm was subsequently formed on the dielectric layer 22 by EB vapor deposition. The reflective electrode 21 was in contact with the p-type contact layer 14 in the opening portion formed in the dielectric layer 22 by the preceding etching process. The reflective electrode 21 was separated into the line electrode 21a and the dot electrodes 21b by the dielectric layer 22. The reflective electrode layer 20 was configured by the dielectric layer 22 and reflective electrode 21 (FIG. 6C).

TaN (100 nm), TiW (100 nm), and TaN (100 nm) were then successively deposited on the reflective electrode layer 20 by sputtering to form a barrier metal layer 26. The barrier metal layer 26 may be configured by a single layer or two or more layers including a high-melting point metal such as Ta, Ti, or W, or a nitride thereof. Furthermore, the barrier metal layer 26 can also be formed by EB vapor deposition in addition to sputtering. A heat treatment was subsequently performed in a nitrogen atmosphere at about 500° C. An adequate ohmic contact was thus established between the reflective electrode 21 and p-type contact layer 14.

Figure 6D:
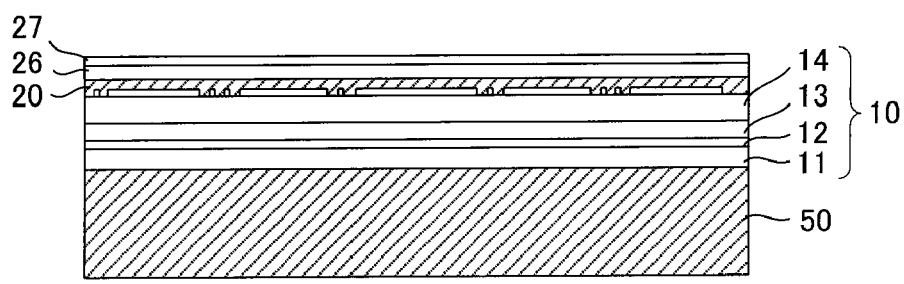

Ni (300 nm) and Au (30 nm) were then successively deposited on the barrier metal layer 26 by EB vapor deposition to form an adhesive layer 27. Resistance heating vapor deposition or sputtering can also be used to form the adhesive layer 27 (FIG. 6D).

<Support Substrate Joining Step>

An Si substrate provided with electrical conductivity by doping a p-type impurity was used as the support substrate 30 for supporting the semiconductor film 10. Ohmic metal layers 31 and 32 composed of Pt and provided with a thickness of 200 nm were formed on both sides of the support substrate 30 by EB vapor deposition. Ti (150 nm), Ni (100 nm), and AuSn (600 nm) were then successively deposited on the ohmic metal layer 32 by sputtering to form an adhesive layer 33. The AuSn layer was used as a eutectic joint material. The Ni layer serves to improve wettability with the eutectic joint material. The Ti layer serves to improve adhesion between Ni and the ohmic metal layer 32. The ohmic metal layers 31 and 32 are not limited to Pt and can be obtained using another material capable of forming an ohmic contact with an Si substrate, such as Au, Ni, or Ti. Furthermore, the support substrate 30 may be configured using another material provided with electrical conductivity and high thermal conductivity, such as Ge, Al, or Cu.

Figure 7A:
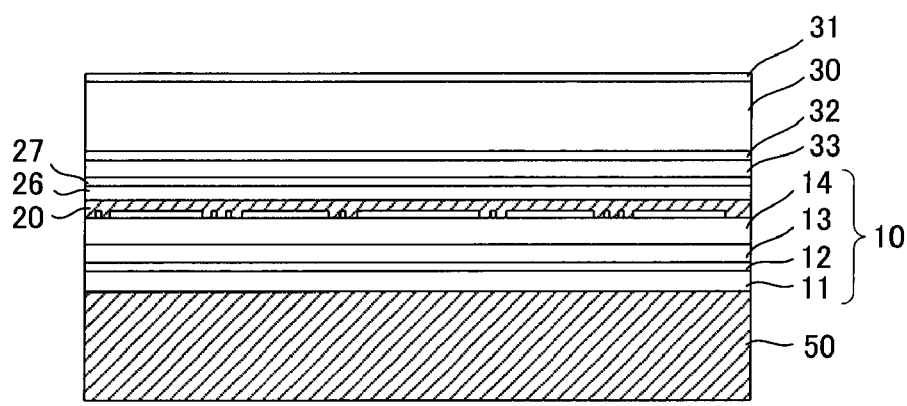
FIGS. 7A through 7C are cross-sectional views showing a method for producing the semiconductor light-emitting device according to an embodiment of the present invention.

The semiconductor film 10 and the support substrate 30 were bonded together by thermo-compression bonding. The adhesive layer 27 on the semiconductor film 10 and the adhesive layer 33 on the support substrate 30 were closely bonded together and kept for 10 minutes in a nitrogen atmosphere at 1 MPa and 330° C. The eutectic joint material (AuSn) contained in the adhesive layer 33 on the support substrate 30 was melted to form AuSnNi with the adhesive layer 27 (Ni/Au) on the semiconductor film 10, whereby the support substrate 30 and the semiconductor film 10 were bonded together (FIG. 7A).

<Growth Substrate Removal Step>

Figure 7B:
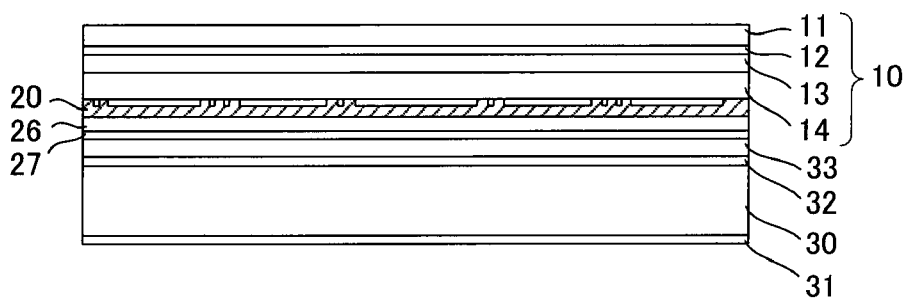

The growth substrate 50 used for the crystal growth of the semiconductor film 10 was removed by wet etching using a liquid mixture of ammonia water and hydrogen peroxide water. However, dry etching, mechanical polishing, or chemical mechanical polishing (CMP) may be used to remove the growth substrate 50 (FIG. 7B).

<Formation of Electrode on the Light-Extraction-Surface Side>

Figure 7C:
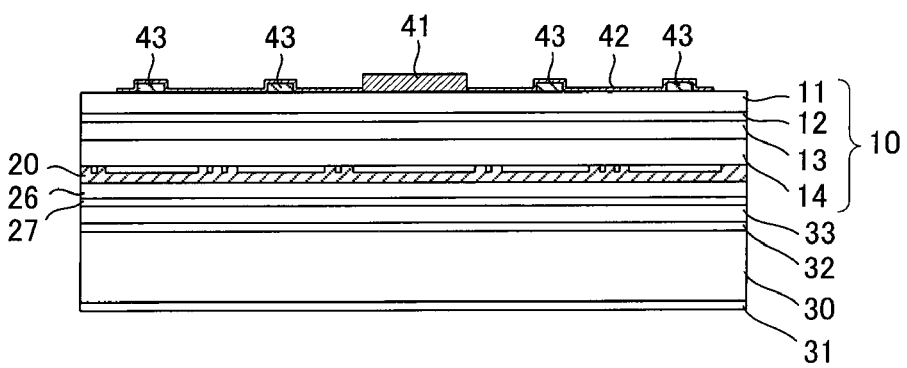

An light-extraction-surface-side ohmic electrode 43, a Schottky electrode 41, and a connecting wiring 42 were formed on the n-type cladding layer 11 exposed by removing the growth substrate 50. AuGeNi, which was used to form an ohmic contact with the n-type cladding layer 11, was deposited on the n-type cladding layer 11 by EB vapor deposition, and patterning was then performed by "lift-off" method to form an ohmic electrode 43. Ti (100 nm), which was used to form a Schottky contact with the n-type cladding layer 11, was subsequently deposited on the n-type cladding layer 11 by EB vapor deposition, and Au (1.5 µm) was further deposited on the Ti. Patterning was then performed by lift-off to form a Schottky electrode 41 and a connecting wiring 42. AuGe, AuSn, AuSnNi, or the like can also be used as the material for the ohmic electrode 43. Ta, W, an alloy thereof, or a nitride thereof can also be used as the material for the Schottky electrode 41. A heat treatment was subsequently performed in a nitrogen atmosphere at 400° C. in order to promote the formation of an ohmic contact between the n-type cladding layer 11 and the ohmic electrode 43 (FIG. 7C). The semiconductor light-emitting device 1 was completed once these steps were performed.

In the semiconductor light-emitting device 1 according to the present embodiment, the distance "a" between the line electrode 21a and the dot electrodes 21b on the reflection surface side is 13 µm, the horizontal distance "b" between the ohmic electrode 43 on the light-extraction surface side and the dot electrodes 21b on the reflection surface side is 20 µm, and the distance "c" between mutually adjacent dot electrodes is 20 µm, satisfying the conditions of the electrode arrangement needed to achieve a uniform current density distribution represented by Equation (5).

<Simulation Results>

The current density distribution during driving of the semiconductor light-emitting device 1 of the embodiment according to the present invention was calculated by simulation. Simulations were also performed for a semiconductor light-emitting device of Comparative Examples 1 and 2 having different electrode arrangements from that of the semiconductor light-emitting device 1 according to the embodiment of the invention.

Figure 8A:
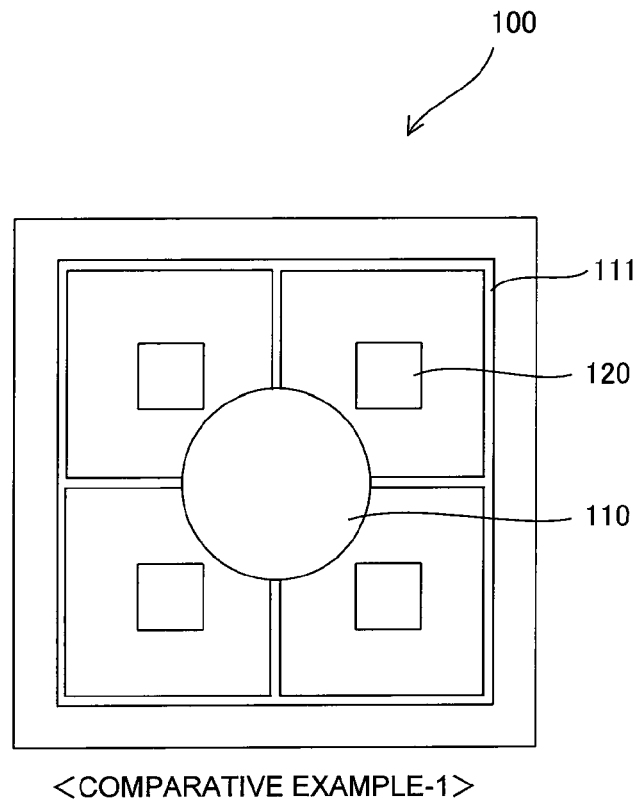
FIGS. 8A and 8B are plan views showing the electrode configuration of the semiconductor light-emitting device of a comparative example.

First, the electrode configuration of a semiconductor light-emitting device 100 of Comparative Example-1 is described with reference to FIG. 8A. In the semiconductor light-emitting device 100 of Comparative Example-1, a circular Schottky electrode 110 having a diameter of 100 µm is disposed at the center of the light extraction surface. An ohmic electrode 111 on the light-extraction surface side has a linear shape and is composed of a portion that extends in a cross shape from the Schottky electrode 110 toward the sides of the semiconductor light-emitting device 100, and a portion that extends along the outer edge of the semiconductor light-emitting device 100. A roughly rectangular reflective electrode 120 is disposed on the light reflection surface side in each of the four regions segmented by the ohmic electrode 111 on the side facing the light extraction surface. In the semiconductor light-emitting device 100 according to the comparative example, the reflective electrode is not clearly separated into a line electrode and dot electrodes. The other features of the electrode configuration are the same as those of the semiconductor light-emitting device 1 according to the embodiment of the invention.

Figure 8B:
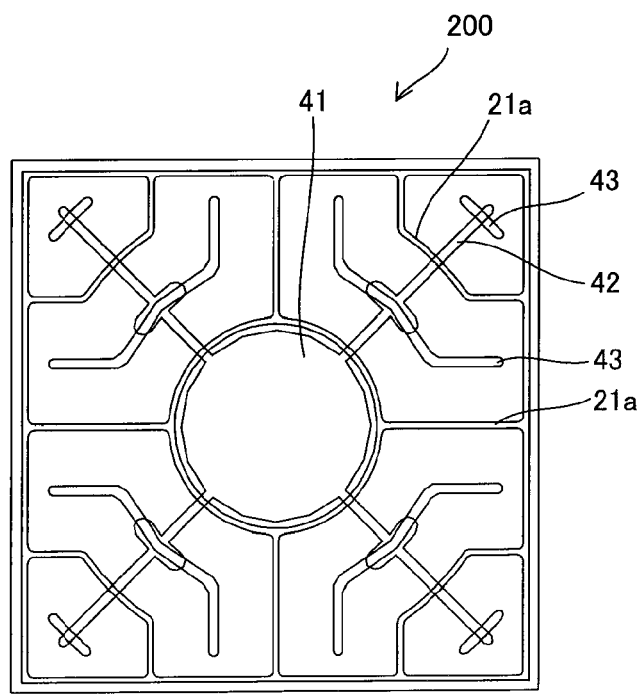

Next, the electrode configuration of a semiconductor light-emitting device 200 of Comparative Example-2 is described with reference to FIG. 8B. The semiconductor light-emitting device 200 of Comparative Example-2 is different from the semiconductor light-emitting device 1 according to the embodiment of the invention in that the reflective electrode has only a line electrode 21a and is devoid of dot electrodes. The ohmic electrode 43 and the Schottky electrode 41 on the light-extraction surface side are the same as those of the semiconductor light-emitting device 1.

Figures 9, 10:
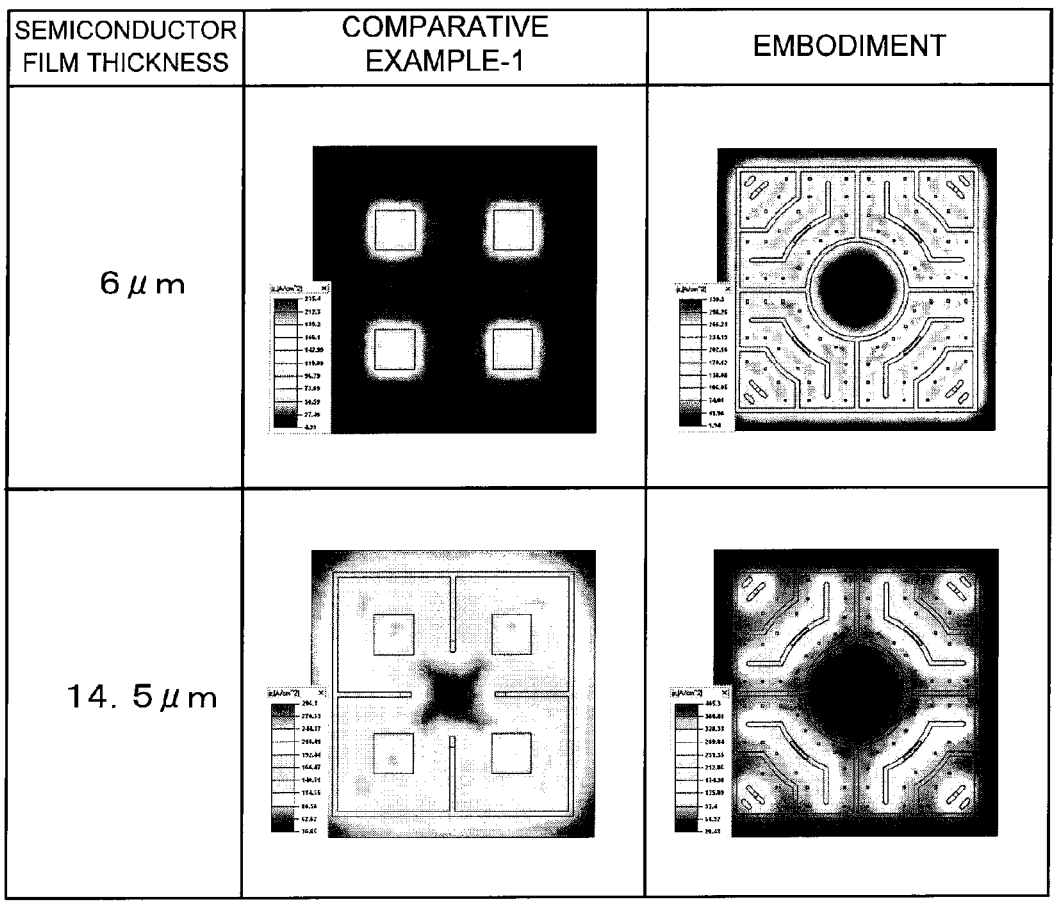
FIG. 9 is a diagram showing simulation results for the current density distribution.
FIG. 10 is a diagram showing simulation results for the current density distribution.

FIG. 9 is a diagram showing simulation results for the current density distribution in the semiconductor light-emitting device 1 (right side of FIG. 9) according to the embodiment of the invention, and the semiconductor light-emitting device 100 (left side of FIG. 9) of Comparative Example-1. The simulation was carried out for a case in which the overall thickness of the semiconductor film 10 was set to 6 µm by setting the thickness of the p-type contact layer 14 to 1.5 µm, and a case in which the overall thickness of the semiconductor film 10 was set to 14.5 µm by setting the thickness of the p-type contact layer 14 to 10 µm. In FIG. 9, the magnitude of the current density is represented by gray-scale or gradation of luminance. Specifically, the clearer or larger the distinction is between the darker portions and the lighter portions, the less uniform the current density distribution is in the semiconductor film in FIG. 9. The premise is that no current flows immediately underneath the Schottky electrode 41 on the light-extraction surface side. This portion is therefore removed from evaluation object.

In the semiconductor light-emitting device 100 of Comparative Example-1, the current was confirmed to concentrate on the reflective electrode 120 both when the thickness of the semiconductor film was 6 µm and when the thickness was 14.5 µm. The current concentration was more pronounced in thicker semiconductor films. In the semiconductor light-emitting device 1 according to the embodiment of the invention, however, the current density distribution was confirmed to be substantially uniform when the thickness of the semiconductor film 10 was 6 µm. In the semiconductor light-emitting device 200 according to Comparative Example-2, the current was confirmed to concentrate both in a case in which the thickness of the semiconductor film was 6 µm and in a case in which the thickness was 14.5 µm. Specifically, the current was confirmed to concentrate on the line electrode 21a on the reflection surface side when the thickness of the semiconductor film was 6 µm, and was confirmed to concentrate immediately underneath the ohmic electrode 43 on the light-extraction surface side when the thickness of the semiconductor film was 14.5 µm. Furthermore, the concentration of current in the semiconductor light-emitting device 200 according to Comparative Example-2 was less than in the semiconductor light-emitting device 100 according to Comparative Example-1 when the thickness of the semiconductor film was 6 µm, and was less than both in the semiconductor light-emitting device 1 according to the embodiment of the invention and the semiconductor light-emitting device 100 according to Comparative Example-1 when the thickness of the semiconductor film was 14.5 µm. It was thus confirmed that the current was insufficiently diffused and was concentrated in a thin semiconductor film when the reflective electrode on the reflection surface side had only a line electrode and was devoid of dot electrodes.

FIG. 10 shows, as numerical data, the simulation results shown in FIG. 9, and the results are represented as differences between current densities. Specifically, the lower value indicates a less uniform current density distribution in FIG. 10. It has been quantitatively confirmed that if the thickness of the semiconductor film 10 is set at 6 µm in the semiconductor light-emitting device 1 according to the embodiment of the invention, the difference between the current densities in the semiconductor film 10 is 70 A/cm², which is much lower than in other cases, and a uniform current density can be maintained.

<Measurement Results>

FIG. 11 shows the measurement result of the light-emission distribution when the thickness of the semiconductor films was 6 μm and 14.5 μm, respectively, in the actually produced semiconductor light-emitting device 1 according to the embodiment of the invention and the semiconductor light-emitting device 100 according to Comparative Example-1. In FIG. 11, the magnitude of the light-emission intensity is represented by gray-scale of luminance. The clearer or larger the distinction is between the darker portions and the lighter portions, the less uniform the light-emission distribution is. The result for the light-emission distribution is generally consistent with the simulation results of the current density distribution shown in FIG. 9, and it was possible to obtain a uniform light-emission distribution when thickness of the semiconductor film 10 was 6 μm in the semiconductor light-emitting device 1 according to the embodiment of the invention. In other cases, the light-emission intensity of regions in which the simulation had confirmed the existence of current concentration was noted to have a tendency to be higher than in other regions.

Figure 12:
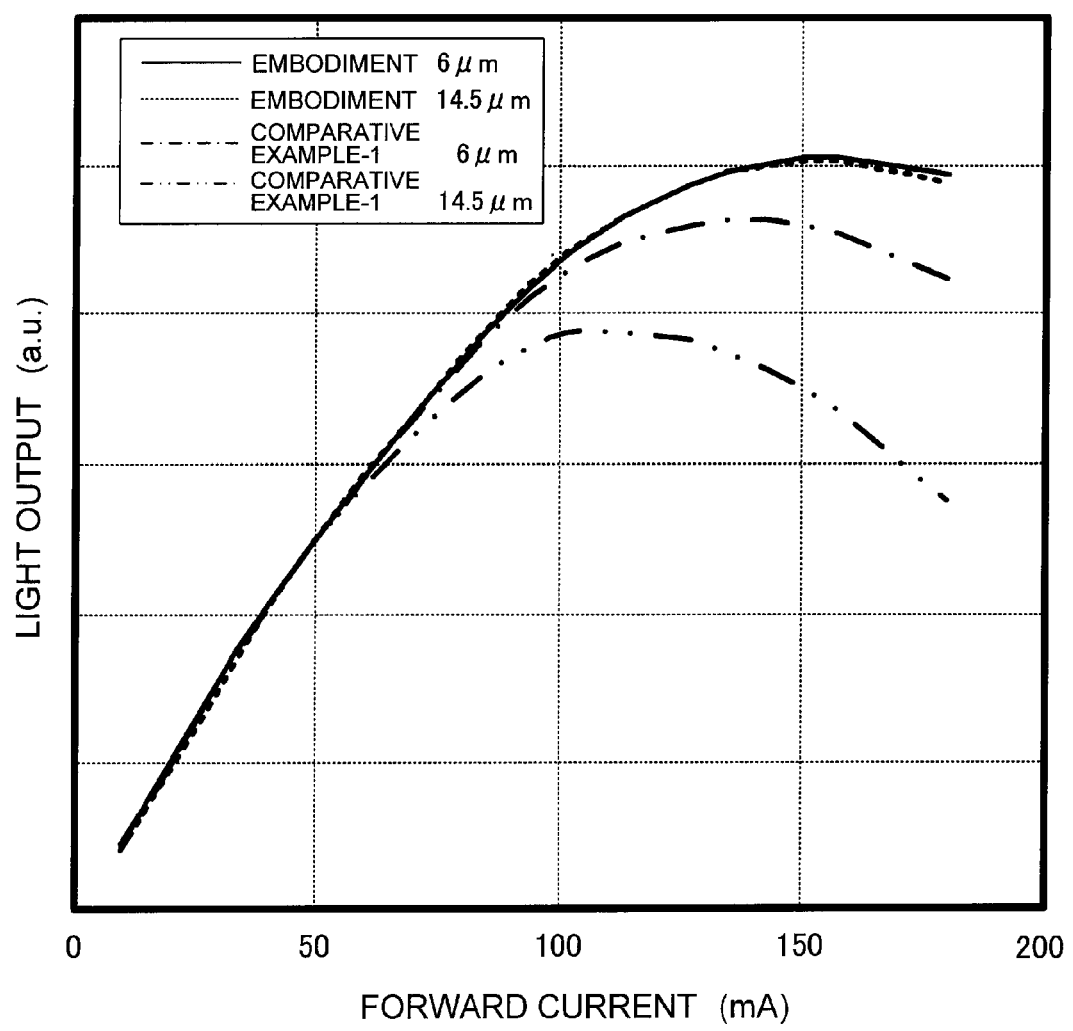
FIG. 12 is a diagram showing the measurement results of the current/light output characteristics.

FIG. 12 shows the measurement result of the current/light output characteristics when the thickness of the semiconductor film 10 was 6 μm and 14.5 μm, respectively, in the semiconductor light-emitting device 1 according to the embodiment of the invention and the semiconductor light-emitting device 100 according to Comparative Example-1. FIG. 13 shows the current value at saturated light output (referred to as the "saturation current value" hereinafter) in the aforementioned four cases. As shown in FIG. 12, light-emission efficiency was increased significantly compared to that in the comparative examples by adopting the electrode configuration according to the present embodiment. Particularly in the case of the electrode configuration according to the present embodiment, the decrease in light-emission efficiency was small and the difference from Comparative Example-1 was significant in a region where the current was relatively large. In a case in which thickness of the semiconductor film was 6 μm, the saturation current was improved 37% over that in the comparative examples by adopting the electrode configuration according to the present embodiment.

FIG. 14 shows the values of forward voltage $V_F$ achieved when a current of 90 mA was allowed to flow in the forward direction in the aforementioned four cases. It was confirmed that adopting the electrode configuration according to the present embodiment allowed the value of the forward voltage $V_F$ to be reduced to about 200 to 300 mV below that in the comparative examples. The reason is that the line electrode 21*a* and the dot electrodes 21*b* on the reflection surface side of the semiconductor light-emitting device 1 according to the present embodiment are disposed on both sides of the ohmic electrode 43 on the light-extraction surface side, and the distance (i.e., current path) between the electrodes is shorter than in the comparative examples.

Adopting the semiconductor light-emitting device of the invention thus allows current concentration to be prevented and the current density distribution in the semiconductor film to be made uniform even when the semiconductor film being is relatively thin. Therefore, a uniform light-emission distribution can be obtained, localized heat generation or electric field concentration can be prevented, and high reliability can be achieved.

Second Embodiment

Figure 15:
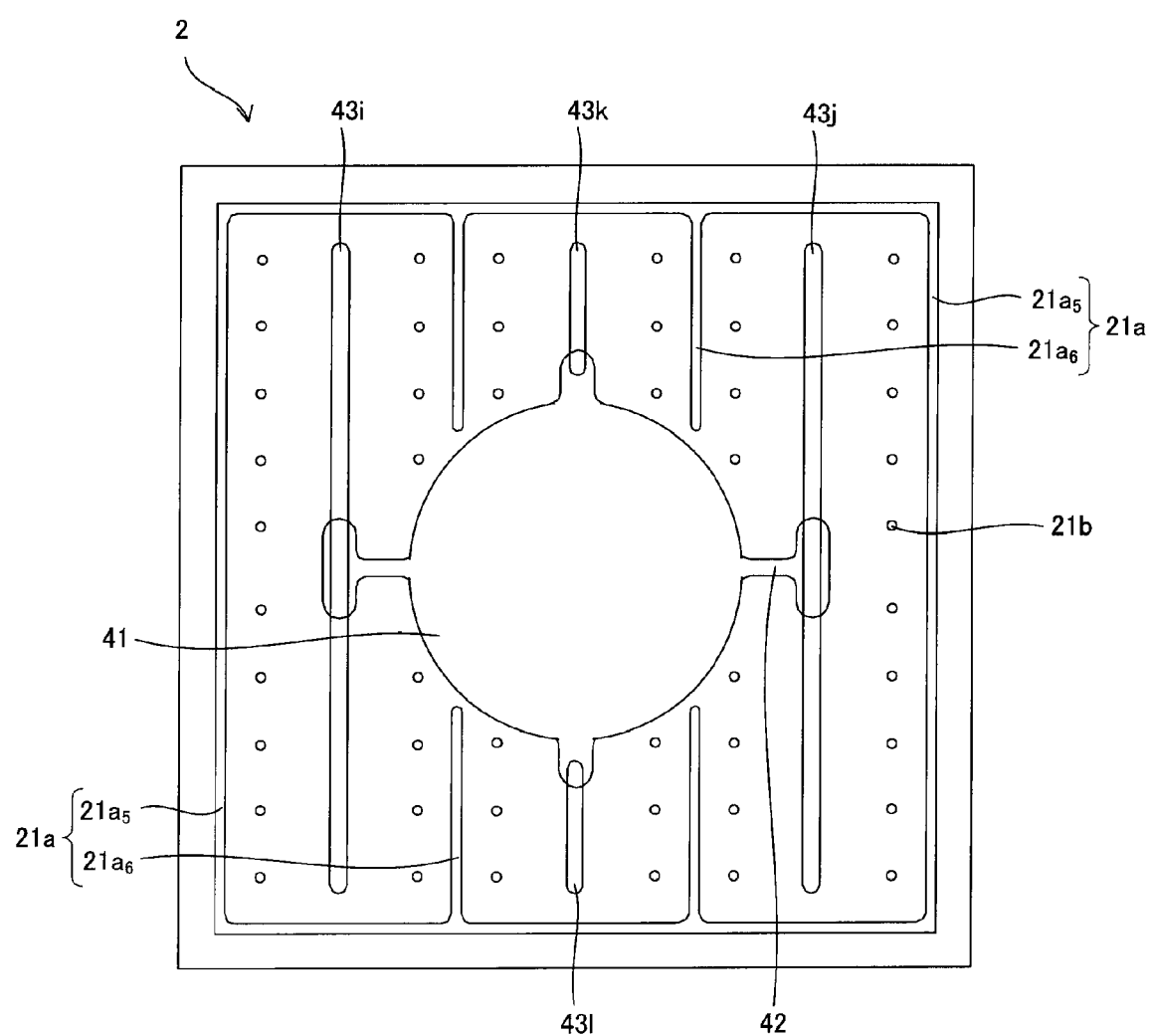
FIG. 15 is a plan view showing the electrode configuration of the semiconductor light-emitting device according to a second embodiment of the present invention.

FIG. 15 is a plan view showing the electrode configuration of the semiconductor light-emitting device 2 according to a second embodiment of the invention. In the semiconductor light-emitting device 2, a Schottky electrode 41 and an ohmic electrode 43 are formed on the light-extraction surface side, and a line electrode 21*a* and the dot electrodes 21*b* are formed on the reflective surface side in the same manner as in the semiconductor light-emitting device 1 according to the first embodiment. The electrodes are shown on the same plane in FIG. 15.

The semiconductor light-emitting device 2 is, for example, shaped as a 310 μm square. The Schottky electrode 41 is, for example, shaped as a circle having a diameter of 100 μm and is disposed at the center of the surface of a semiconductor film. The light-extraction-surface-side ohmic electrode 43 is constituted by linear electrode pieces 43*i* and 43*j* disposed on both sides of the Schottky electrode 41 so as to be parallel to the two mutually opposed sides of the semiconductor light-emitting device 2, and by electrode pieces 43*k* and 43*l* disposed so as to be parallel to the electrode pieces 43*i* and 43*j* on the center line of the Schottky electrode 41. The electrode pieces 43*i* through 43*l* are electrically connected to the Schottky electrode 41 by connecting wirings 42. The reflection-surface-side line electrode 21*a* is constituted by a first portion 21*a*₅ that extends along the outer edge of the semiconductor light-emitting device 2, and by a second portion 21*a*₆ that is connected to the first portion 21*a*₅ and extends so as to be parallel to the electrode pieces 43*i* through 43*l* between the electrode pieces 43*i* through 43*l* that constitute the reflection-surface-side ohmic electrode 43. The dot electrodes 21*b* on the reflection surface side are disposed in a row so as to be along the electrode pieces 43*i* through 43*l* of the ohmic electrode 43 on the light-extraction surface side. The aspects similar to the semiconductor light-emitting device 1 according to the first embodiment are that the line electrode 21*a* and the dot electrodes 21*b* on the reflection surface side are disposed on both sides of the electrode pieces 43*i* through 43*l* constituting the light-extraction-surface-side ohmic electrode 43, and that the electrodes are disposed so as to satisfy the above described conditions 1 through 3. The configuration is the same as that of the semiconductor light-emitting device 1 according to the first embodiment except for the layout of the electrodes on the light-extraction-surface side and the reflection-surface. With the semiconductor light-emitting device 2 according to the second embodiment, current concentration can be prevented from occurring and the current density in a semiconductor film can be uniformly distributed even when the semiconductor film is relatively thin, as in the case of the first embodiment. A uniform light-emission distribution can thereby be obtained, and high reliability can be secured. Furthermore, in the semiconductor light-emitting device 2 according to the second embodiment, the overall electrode shape that includes the electrodes on the light-extraction surface side and the electrodes on the reflection surface side is patterned so as to achieve two-quadrant rotational symmetry when the center point of the semiconductor light-emitting device 2 is the rotation axis. This electrode configuration makes it possible to easily respond to a change in the layout of the electrode pattern when the size of a semiconductor light-emitting device is changed.

The invention has been described with reference to the preferred embodiments thereof. It should be understood by those skilled in the art that a variety of alterations and modifications may be made from the embodiments described above. It is therefore contemplated that the appended claims encompass all such alternations and modifications.

This application is based on Japanese Patent Application No. 2010-026386 which is hereby incorporated by reference.

What is claimed is:

1. A semiconductor light-emitting device including a support substrate, a reflective electrode that has optical reflectivity and is provided on the support substrate; an AlGaInP-based semiconductor film that includes a light-emission layer and is provided on the reflective electrode, and a surface electrode provided on the semiconductor film, wherein said surface electrode includes an ohmic electrode constituted by a plurality of electrode pieces disposed on said semiconductor film in a distributed manner and used for forming an ohmic contact with the semiconductor film;

said reflective electrode is constituted by a linearly shaped line electrode and a plurality of island-shaped dot electrodes provided on both sides of each of said electrode pieces that constitute said ohmic electrode, along the electrode pieces;

said surface electrode and said reflective electrode are disposed so as to satisfy the following equations:

$b > a$, and $0.8(a^2+2ab)^{1/2} < c < 2.4(a^2+2ab)^{1/2}$, where "a" is the distance between said line electrode and said dot electrodes, "b" is the distance between said ohmic electrode and the dot electrodes when the ohmic electrode and the dot electrodes are projected onto a plane parallel to the principal surface of said semiconductor film, and "c" is the distance between mutually adjacent dot electrodes; and the thickness of said semiconductor film is 6 μm or less.

2. The semiconductor light-emitting device according to claim 1, wherein an electrode shape that includes said surface electrode and said reflective electrode has four-quadrant rotational symmetry.

3. The semiconductor light-emitting device according to claim 1, wherein an electrode shape that includes said surface electrode and said reflective electrode has two-quadrant rotational symmetry.

4. The semiconductor light-emitting device according to claim 1, wherein said surface electrode forms a Schottky contact with said semiconductor film and further includes a Schottky electrode electrically connected to said ohmic electrode.

* * * * *